(12) United States Patent
Shin

(10) Patent No.: US 10,021,760 B2
(45) Date of Patent: Jul. 10, 2018

(54) ORGANIC LIGHT EMITTING DISPLAY DEVICE

(71) Applicant: LG Display Co., Ltd., Seoul (KR)

(72) Inventor: Hongdae Shin, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 378 days.

(21) Appl. No.: 14/723,647

(22) Filed: May 28, 2015

(65) Prior Publication Data

US 2016/0174332 A1    Jun. 16, 2016

(30) Foreign Application Priority Data

Dec. 16, 2014 (KR) .................. 10-2014-0181823

(51) Int. Cl.
| | | |
|---|---|---|
| H05B 33/14 | (2006.01) | |
| H05B 33/06 | (2006.01) | |
| H01L 51/52 | (2006.01) | |
| H01L 51/00 | (2006.01) | |

(52) U.S. Cl.
CPC ......... *H05B 33/14* (2013.01); *H01L 51/5243* (2013.01); *H05B 33/06* (2013.01); *H01L 51/0097* (2013.01); *H01L 2251/5338* (2013.01)

(58) Field of Classification Search
CPC .............................. H05B 33/14; H05B 33/06
See application file for complete search history.

(56) References Cited

U.S. PATENT DOCUMENTS

| | | |
|---|---|---|
| 2005/0127818 A1 | 6/2005 | Ohtani |
| 2010/0117067 A1 | 5/2010 | Sin et al. |
| 2011/0121352 A1 | 5/2011 | Hesse et al. |
| 2011/0121717 A1 | 5/2011 | Lee et al. |
| 2012/0181929 A1 | 6/2012 | Ha |
| 2014/0103315 A1 | 4/2014 | Jung et al. |
| 2016/0043344 A1 | 2/2016 | Shin |

FOREIGN PATENT DOCUMENTS

| | | |
|---|---|---|
| CN | 1545120 A | 11/2004 |
| CN | 101009300 A | 8/2007 |
| CN | 101740608 A | 6/2010 |
| CN | 102130308 A | 7/2011 |
| CN | 103730483 A | 4/2014 |
| CN | 103943663 A | 7/2014 |
| CN | 106206644 A | 12/2016 |
| EP | 1533852 A2 | 5/2005 |
| EP | 2323191 A2 | 5/2011 |
| EP | 2983226 A1 | 2/2016 |

OTHER PUBLICATIONS

Communication dated Apr. 25, 2016 from the European Patent Office in counterpart European application No. 15172490.3.
The First Office Action dated Apr. 16, 2018, from the State Intellectual Property Office of People's Republic of China in unterpart Chinese application No. 201510358403.8. Note: US 2011/0121352 a cited therein is already of record.

*Primary Examiner* — Joseph L Williams
(74) *Attorney, Agent, or Firm* — Morgan, Lewis & Bockius LLP

(57) ABSTRACT

An OLED device according to an example embodiment includes an organic light-emitting element between a lower substrate and an upper substrate. At least a part of a side surface of the upper substrate has a reverse-tapered shape configured to reduce damage to the lower substrate caused by deformation of the upper substrate due to an external impact. Accordingly, reliability issues resulting from a short circuit or burnt lines due to the deformation of the upper substrate may be resolved, improving overall reliability and productivity of an OLED device.

23 Claims, 6 Drawing Sheets

ORGANIC LIGHT EMITTING DISPLAY DEVICE

CROSS-REFERENCE TO RELATED APPLICATIONS

This application claims the priority of Korean Patent Application No. 10-2014-0181823 filed on Dec. 16, 2014, in the Korean Intellectual Property Office, the entire disclosure of which is incorporated herein by reference for all purposes.

BACKGROUND OF THE INVENTION

Field of the Invention

The present disclosure relates to an organic light-emitting display device that may resolve the reliability issues that occur when an upper substrate is bent toward a lower substrate due to an external impact, or the like.

Description of the Related Art

An organic light-emitting display (OLED) device is an emerging technology for flat display devices and bears the advantage of being self-luminous. That is, unlike a liquid crystal display (LCD) device, an OLED device does not require a separate light source. An OLED device can therefore typically be lighter and thinner than an LCD device. In addition, an OLED device typically exhibits a better viewing angle and contrast ratio, lower power consumption, higher luminance, and shorter response time than an LCD device. Thus, an OLED device is seen as promising for a next generation display device.

An OLED device may typically include an organic light-emitting element composed of an anode, a cathode, and an organic light-emitting layer therebetween. The organic light-emitting element generates light by using an energy released when excitons, formed by combining electrons and holes injected from two electrodes, relax from an excited state to the ground state. By using this mechanism, an OLED device may display images.

OLED devices can generally be sorted into a top emission OLED device, a bottom emission OLED device, or a dual emission OLED device, depending on the direction in which light is emitted. Further, OLED devices can generally be sorted into an active matrix OLED device or a passive matrix OLED device, depending on the driving manner.

SUMMARY OF THE INVENTION

Typically, an OLED device may include a lower substrate on which an organic light-emitting element is formed and an upper substrate facing the lower substrate. In a bottom emission OLED device, a metal substrate may be used for an upper substrate. Because light is emitted via the lower substrate in a bottom emission OLED device, the upper substrate may be a non-transparent metal substrate.

Such an OLED device may be manufactured by attaching the lower substrate (on which the organic light-emitting element is formed) to the upper substrate having an adhesive layer. During such a manufacturing process, continuous strikes may be inflicted on a side surface of the upper substrate when aligning the upper substrate with other elements. For example, when an adhesive layer is attached to the upper substrate, a process of aligning the upper substrate with the equipment, or the upper substrate with the adhesive layer, is carried out to accurately locate the adhesiveness at a desired position. The alignment process may be carried out by adjusting the position of the upper substrate by continuously striking the side surface of the upper substrate.

The side surface of the upper substrate may be bent or twisted toward the lower substrate due to these continuous strikes, so that the upper substrate may be in contact with lines formed on the lower substrates, and a short circuit may be created, resulting in a burnt line. That is, a short circuit may be created because the upper substrate made of a metal material comes in contact with the lines finely patterned on the lower substrate, and in turn the lines are burnt out. Reliability issues such as these short circuit and/or burnt defects may seriously harm the reliability and productivity of OLED devices.

In view of this, there is proposed a structure of the side surface of the upper substrate that is not easily bent toward the lower substrate due to an external impact during the manufacturing process. A novel structure of an OLED device that is capable of controlling the shape or direction of the bent upper substrate, or how much the upper substrate is bent, is set forth in the present disclosure.

In view of the above, an object of the present disclosure is to provide an organic light-emitting display (OLED) device that resolves the reliability issues caused by the deformation of an upper substrate during the manufacturing process of the OLED device, in which a first side surface of the upper substrate is extended from an one end of the bottom surface of the upper substrate at an obtuse angle with respect to the bottom surface of the upper substrate.

Another object of the present disclosure is to provide an OLED device with improved productivity and reliability by resolving reliability issues caused by the deformation of an upper substrate, in which the in-plane area of the upper substrate may continuously increase from its bottom surface to its top surface.

Objects of the present invention are not limited to those described above and other objects will be clearly understood by those skilled in the art from the following descriptions.

An OLED device according to an example embodiment includes an organic light-emitting element disposed between the lower and upper substrates. At least a part of a side surface of the upper substrate has a reverse-tapered shape configured to reduce damage to the lower substrate caused by deformation of the upper substrate due to an external impact. Accordingly, reliability issues resulting from a short circuit or burnt defects due to the deformation of the upper substrate may be resolved, thereby improving reliability and productivity.

An organic light-emitting display (OLED) device according to an example embodiment includes an organic light-emitting element on a top surface of a lower substrate, an upper metal substrate having a bottom surface facing the top surface of the lower substrate, and an adhesive layer between the lower substrate and the upper metal substrate configured to seal the organic light-emitting element. According to the example embodiment, the organic light-emitting display device has a first side surface at an obtuse angle with respect to the bottom surface of the upper metal substrate.

An organic light-emitting display (OLED) device according to an example embodiment includes an upper substrate, an organic light-emitting layer, and a lower substrate, each of the upper substrate and the lower substrate including a top surface and a bottom surface. The organic light-emitting layer is between the bottom surface of the upper substrate and the top surface of the lower substrate, a protruding portion of the upper substrate protrudes beyond the organic light-emitting layer in a cross-section view, and the protruding portion of the upper substrate includes a side surface having a first side surface with a reverse-tapered shape.

Accordingly, reliability issues resulting from a short circuit or burnt defects due to the deformation of the upper substrate during the manufacturing process of the OLED devices are resolved, thereby improving reliability and productivity.

It should be noted that examples and effects of the present disclosure are not limited to those described above and other effects of the present disclosure will be apparent to those skilled in the art from the following descriptions.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE EMBODIMENTS

Figure 1:
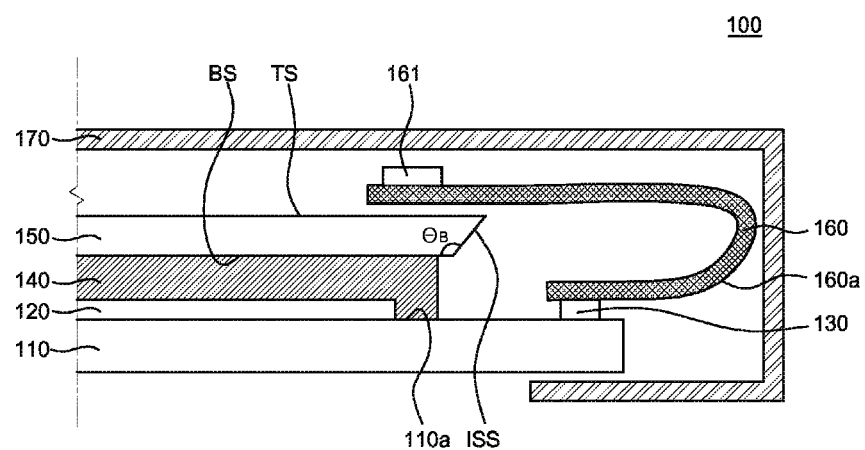
FIG. 1 is a cross-sectional view of an OLED device according to an example embodiment of the present disclosure.

Advantages and features of the present disclosure and methods to achieve them will become apparent from the descriptions of example embodiments herein below with reference to the accompanying drawings. However, the present disclosure is not limited to example embodiments disclosed herein but may be implemented in various different forms. The example embodiments are provided for making the disclosure of the present disclosure thorough and for fully conveying the scope of the present disclosure to those skilled in the art. It is to be noted that the scope of the present disclosure is defined only by the claims.

The figures, dimensions, ratios, angles, numbers of elements given in the drawings are merely illustrative and are not limiting. Like reference numerals may denote like elements throughout the descriptions. Further, in describing the present disclosure, descriptions of well-known technologies may be omitted in order not to obscure the gist of the present disclosure.

It is to be noticed that the terms "comprising," "having," "including" and so on, used in the description and claims, should not be interpreted as being restricted to the means listed thereafter unless specifically stated otherwise. Where an indefinite or definite article is used when referring to a singular noun, e.g. "a," "an," "the," this includes a plural of that noun unless specifically stated otherwise.

In describing elements, they are interpreted as including error margins even without explicit statements.

In describing positional relationship, such as "an element A on an element B," "an element A above an element B," "an element A below an element B," and "an element A next to an element B," another element C may be disposed between the elements A and B unless the term "directly" or "immediately" is explicitly used.

In describing temporal relationship, terms such as "after," "subsequent to," "next to," and "before" are not limited to "directly after," "directly subsequent to," "immediately next to" "immediately before," and so on, unless otherwise specified.

The terms "first," "second," "third," and the like in the descriptions and in the claims are used for distinguishing between similar elements and not necessarily for describing a sequential or chronological order. These terms are used to merely distinguish one element from another. Accordingly, as used herein, a first element may be a second element within the technical idea of the present disclosure.

The drawings are not to scale and the relative dimensions of various elements in the drawings are depicted schematically and not necessarily to scale.

Features of various example embodiments of the present disclosure may be combined partially or totally. As will be clearly appreciated by those skilled in the art, technically various interactions and operations are possible. Various example embodiments can be practiced individually or in combination.

Hereinafter, organic light-emitting display (OLED) devices according to example embodiments of the present disclosure will be described with reference to the accompanying drawings.

FIG. 1 is a cross-sectional view of an OLED device 100 according to an example embodiment of the present disclosure. The OLED device 100 shown in FIG. 1 may be of a bottom emission type and may include a lower substrate 110, an organic light-emitting element 120, a pad 130, an adhesive layer 140, an upper substrate 150, a driving film 160, and a cover 170.

With reference to FIG. 1, the organic light-emitting element 120 and the pad 130 are disposed on a top surface 110a of the lower substrate 110. The upper substrate 150 that has a bottom surface BS facing the top surface 110a of the lower substrate 110 is disposed opposed to the lower substrate 110. The adhesive layer 140 is disposed between the top surface 110a of the lower substrate 110 and the bottom surface BS of the upper substrate 150. The adhesive layer 140 seals the organic light-emitting element 120.

The lower substrate 110 may be made of transparent glass. For a flexible OLED device, the lower substrate 110 may be made of a flexible material such as plastic. Light generated from the organic light-emitting element 120 passes through the lower substrate 100 to be emitted.

The organic light-emitting element 120 may include an anode, an organic light-emitting layer, and a cathode. Although not shown in the drawings, the organic light-emitting element 120 may be connected to a thin-film transistor, a capacitor, etc. The organic light-emitting layer may be a single light-emitting layer emitting light of a color or multiple light-emitting layers emitting light of a white color. However, the structure of the organic light-emitting layer is not limited thereto but may have different layered structures, depending on design choices.

The adhesive layer 140 is disposed on the organic light-emitting element 120. The adhesive layer 140 protects the organic light-emitting element 120 from foreign matters, impact, moisture (e.g., $H_2O$), oxygen (e.g., $O_2$), etc. The lower substrate 110 and the upper substrate 150 are securely attached to each other by the adhesive layer 140. The adhesive layer 140 seals the organic light-emitting element 120 and thus may also be referred to as a sealing layer.

The adhesive layer 140 may be made of a resin such as one selected from a group consisting of epoxy, phenol, amino, unsaturated polyester, polyimide, silicone, acryl, vinyl, and olefin. In addition, the adhesive layer 140 may be made of a curable resin or a pressure sensitive adhesive (PSA). In addition, the adhesive layer 140 may be composed of a plurality of layers.

The adhesive layer 140 may further include a moisture absorbent. The moisture absorbent may chemically react with moisture, oxygen, etc., introduced into the adhesive layer 140, to absorb the moisture, oxygen, etc. The moisture absorbent may be made of, for example, metal powder such as alumina, metal oxide, metal salt, or phosphorus pentoxide ($P_2O_5$).

Although not shown in the drawings, a passivation layer may be disposed between the adhesive layer 140 and the organic light-emitting element 120. The passivation layer can protect the organic light-emitting element 120 more effectively from external moisture, oxygen, etc. The passivation layer may be a single layer made of an inorganic film, or may be composed of a plurality of layers where organic and inorganic films are stacked on one another alternately.

With reference to FIG. 1, the lower substrate 110 protrudes more than the upper substrate 150. In the protruding portion of the lower substrate 110, the pad 130, and the driving film 160 having a driving chip (driver-IC) 161 are disposed as a circuit part. Although not shown in the drawings, lines connecting the pad 130 with the organic light-emitting element 120 are disposed on the lower substrate 110. The organic light-emitting element 120 may receive various signals from the circuit part via the line.

The driving film 160 attached on the pad 130 of the lower substrate 110 is bent toward the top surface of the upper substrate 150, as shown in FIG. 1. For example, the driver integrated circuit (IC) 161 and driving lines (not shown) are formed on a first surface 160a of the driving film 160. The driving lines are connected to the pad 130 of the lower substrate 110 to deliver signals from the driver-IC 161 to the pad 130. In this case, a single-side flexible printed circuit board may be employed as the driving film 160.

As the driving film 160 is bent toward the upper substrate 150, a part of the driving film 160 protrudes more than the lower substrate. As shown in FIG. 1, the cover 170 may be disposed on the outer periphery of the OLED device 100 and may protect the protruding part of the driving film 160 and other internal components.

The upper substrate 150 may be made of a metal material such as alumina (Al), copper (Cu), tungsten (W), or a combination thereof. The thickness of the upper substrate 150 may range from about 10 μm to 200 μm. The upper substrate 150 may be referred to as the upper metal substrate.

As shown in FIG. 1, the upper substrate 150 according to an example embodiment of the present disclosure has the bottom surface BS, the top surface TS facing the bottom surface BS, and a first side surface 1SS. The first side surface 1SS of the upper substrate 150 is a flat surface extended from one end of the bottom surface BS of the upper substrate 150 to one end of the top surface TS of the upper substrate 150. In other words, the first side surface 1SS of the upper substrate 150 spans from one end of the bottom surface BS of the upper substrate 150 to one end of the top surface TS of the upper substrate 150. The first side surface 1SS and the bottom surface BS make an obtuse angle $\theta_B$. That is, the angle $\theta_B$ made by the first side surface 1SS and the bottom surface BS of the upper substrate 150 is greater than 90 degrees and less than 180 degrees. Accordingly, the first side surface 1SS of the upper substrate 150 has a reverse-tapered shape when viewed in the cross section. As the first side surface 1SS of the upper substrate 150 has a reverse-tapered shape, the area of the top surface TS of the upper substrate 150 may be larger than the area of the bottom surface BS of the upper substrate 150. In other words, as shown in FIG. 1, a protruding portion of the upper substrate 150 protrudes beyond the organic light-emitting element 120 in cross-section view, and the protruding portion of the upper substrate 150 includes the side surface having the first side surface 1SS with a reverse-tapered shape.

The in-plane area of the upper substrate 150 increases continuously from the bottom surface BS to the top surface TS of the upper substrate 150. With reference to FIG. 1, as the first side surface 1SS of the upper substrate 150 is a flat surface, the first side surface 1SS has a straight-line, and a reverse-tapered shape when viewed in the cross section. That is, the in-plane area of the upper substrate 150 may linearly increase from the bottom surface BS to the top surface TS of the upper substrate 150, and thus, the area of the top surface of the upper substrate 150 is larger than the area of the bottom surface BS of the upper substrate 150. Accordingly, the first side surface 1SS has a straight-line shape in the vertical cross section of the upper substrate 150.

As mentioned earlier, the first side surface 1SS of the upper substrate 150 may continually receive external impact during the manufacturing process such as an alignment process. Due to such impact, deformation may occur on the first side surface 1SS of the upper substrate 150. For example, the upper substrate 150 may be bent toward the lower substrate 110. At this time, if the upper substrate 150 made of a metal material contacts the lines formed on the lower substrate 110 due to bending toward the lower substrate 110, a short-circuit may be created between the lines on the lower substrate 110. As a result, the area around the lines may be burnt, e.g., causing burnt defects.

In view of this, according to an example embodiment of the present disclosure, the first side surface 1SS of the upper substrate 150 is formed in a reverse-tapered shape making an obtuse angle with the bottom surface BS, and thus reduces the problem that the upper substrate 150 is bent toward the lower substrate 110. For example, as the upper substrate 150 has a slope of the first side surface 1SS, when impact is inflicted on the upper substrate 150, the area of the first side surface 1SS receiving the impact is reduced, so that the force can be dispersed. In particular, if the first side surface 1SS of the upper substrate 150 is sloped in a reverse-tapered shape, the first side surface 1SS is deformed away from the lower substrate 110. Accordingly, it is possible to decrease the burnt defects that the upper substrate 150 comes in contact with the lines on the lower substrate 110.

Accordingly, in the OLED device 100 according to the example embodiment of the present disclosure, the first side surface 1SS of the upper substrate 150 is extended from one end of the bottom surface BS of the upper substrate 150 to one end of the top surface TS of the upper substrate 150 at an obtuse angle with respect to the bottom surface BS of the upper substrate 150. As a result, it is possible to resolve the reliability issues caused by the deformation of the upper substrate 150 when it is bent toward the lower substrate 110 due to an external impact or the like. Accordingly, the reliability and productivity of the OLED device 100 may be improved.

Figure 2:
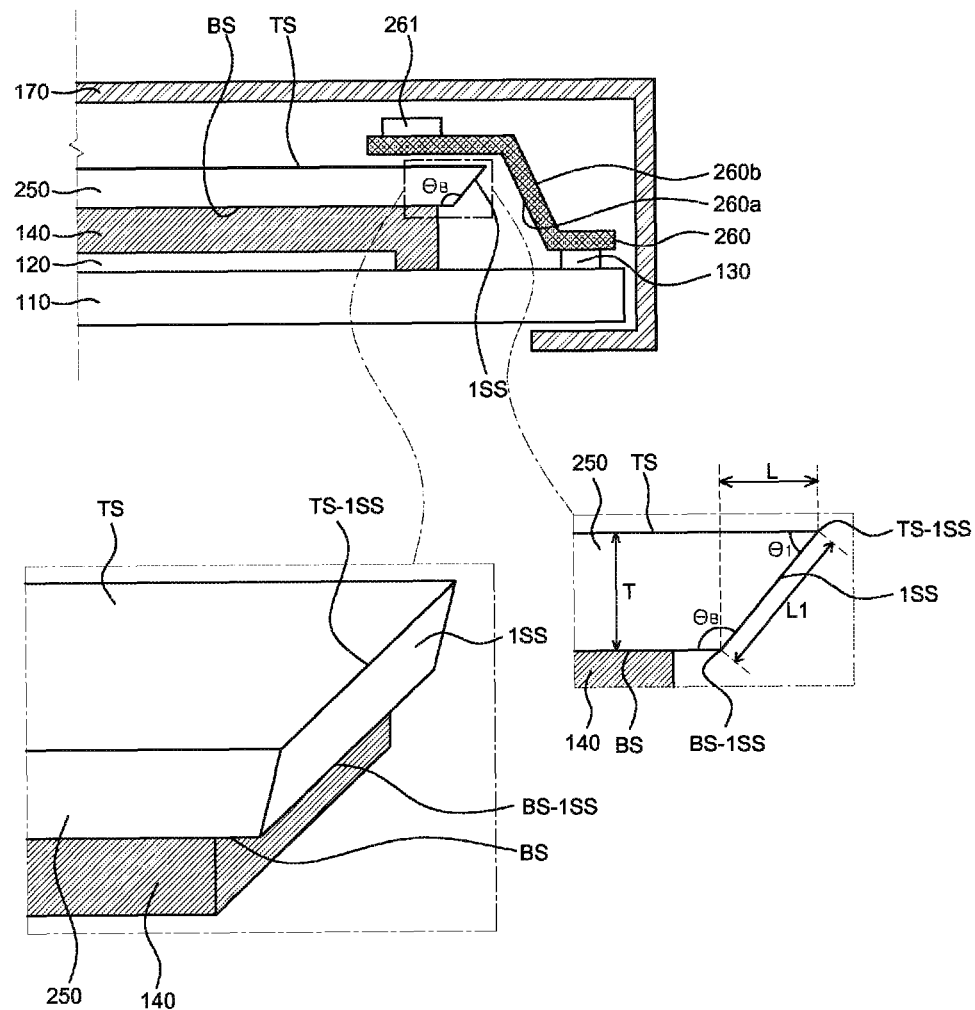
FIG. 2 shows a cross-sectional view and a perspective view of an OLED device according to another example embodiment of the present disclosure.

FIG. 2 shows a cross-sectional view and a perspective view of an OLED device 200 according to another example embodiment of the present disclosure. In describing this example embodiment, descriptions of the same or similar elements as those in the above example embodiment may be omitted.

With reference to FIG. 2, a driving film 260 attached on the pad 130 of the lower substrate 110 may be directly connected to the upper substrate 250 without being bent. Specifically, a driver-IC 261 is disposed on a second surface 260b of the driving film 260. The other surface, e.g., a first surface 260a of the driving film 260, is attached on the pad 130. That is, the driving film 260 may be disposed on the top surface TS of the upper substrate 250 without protruding more than the lower substrate 110. In this case, a double-side flexible printed circuit board may be employed as the driving film 260.

Unlike the OLED device 100 shown in FIG. 1, in the OLED device 200 employing the driving film 260 shown in FIG. 2, no part of the driving film 260 may protrude more than the lower substrate 110. Accordingly, the OLED device 200 may not require space between the lower substrate 110 and the cover 170. Therefore, the OLED device 200 may be advantageous in implementing a narrow bezel.

In the OLED device 200 according to this example embodiment of the present disclosure, the angle $\theta_1$ between the first side surface 1SS and the top surface TS of the upper substrate 250 can be adjusted so that unwanted deformation of the first side surface 1SS of the upper substrate 250 may be reduced and damage to the driving film 260 by the upper substrate 250 may also be reduced and/or minimized.

With reference to the perspective view of FIG. 2, the first side surface 1SS of the upper substrate 250 is a surface extended from one end of the bottom surface BS of the upper substrate 250 to one end of the top surface TS of the upper substrate 250. In other words, the first side surface 1SS may be a plane extended along the shortest path from line BS-1SS where the bottom surface BS meets the first side surface 1SS of the upper substrate 250 to line TS-1SS where the top surface TS meets the first side surface 1SS of the upper substrate 250. In this connection, the first side surface 1SS has a flat surface, and a straight-line, reverse-tapered shape when viewed in the cross section. Therefore, the first side surface 1SS may be a plane extended along the shortest path.

With reference to FIG. 2, the angle $\theta_B$ made by the first side surface 1SS and the bottom surface BS of the upper substrate 250 may be an obtuse angle, and the angle $\theta_1$ made by the first side surface 1SS and the top surface TS of the upper substrate 250 may range from 60 degrees to 90 degrees. In other words, the angle $\theta_1$, which is made by the top surface TS of the upper substrate 250 and the plane extended along the shortest path from line BS-1SS, where the bottom surface BS meets the first side surface 1SS of the upper substrate 250, to line TS-1SS, where the top surface TS meets the first side surface 1SS of the upper substrate 250, may be equal to or greater than 60 degrees and less than 90 degrees. Accordingly, a distance L that is the projection of the first side surface 1SS of the upper substrate 250 onto the top surface TS of the upper substrate 250, (e.g., the distance L indicating a protrusion length of the first side surface 1SS of the upper substrate 250), may be limited.

The distance L that is the projection of the first side surface 1SS of the upper substrate 250 onto the top surface TS of the upper substrate 250 may be expressed by Equation 1:

$$L = \frac{T}{\tan\theta_1} \qquad \text{[Equation 1]}$$

where T denotes thickness of the upper substrate 250, e.g., the shortest distance from the bottom surface BS to the top surface TS of the upper substrate 250. According to Equation 1, the distance L that is the projection of the first side surface 1SS onto the top surface TS of the upper substrate 250 becomes smaller as the angle $\theta_1$ made by the first side surface 1SS and the top surface TS of the upper substrate 250 increases. That is, as the angle $\theta_1$ made by the first side surface 1SS and the top surface TS of the upper substrate 250 is equal to or greater than 60 degrees and less than 90 degrees, the distance L indicating a protrusion length of the first side surface 1SS of the upper substrate 250 can be limited.

Accordingly, in the OLED device 200 according to this example embodiment of the present disclosure, by adjusting the angle $\theta_1$ made by the first side surface 1SS and the top surface TS of the upper substrate 250, it may be possible to reduce the amount that the first side surface 1SS of the upper substrate 250 is bent toward the lower substrate 110 due to an external impact or the like, and also reduce the amount that the first side surface 1SS protrudes toward the driving film 260. Accordingly, defects, which may be caused when the driving film 260 is damaged by the upper substrate 250, can be reduced. For example, the cracks that occur in driving lines formed on the driving film 260 or disconnections between the driving lines can be reduced. Further, reliability issues due to deformation of the upper substrate 250 as the upper substrate 250 is bent toward the lower substrate 110 may be resolved. As a result, the reliability of the OLED device 200 can be improved. Additionally, as the distance L is limited, the upper substrate 250 otherwise overly protrudes toward the driving film 260 such that the protruding portion of the upper substrate 250 may make a scratch on processing equipment handling the upper substrate 250 during the manufacturing process of the OLED device 200. As a result, it may be possible to avoid unnecessary replacement of equipment components, and thus productivity of the OLED device 200 can be improved.

With reference to FIG. 2, the distance L that is the projection of the first side surface 1SS onto the top surface TS of the upper substrate 250 may also be defined as the distance L that is the projection of the shortest distance L1 from line BS-1SS, where the bottom surface BS meets the first side surface 1SS of the upper substrate 250, to line TS-1SS, where the top surface TS meets the first side surface 1SS of the upper substrate 250. In addition, as described above, the first side surface 1SS of the upper substrate 250 may have a flat surface, and a straight-line, reverse-tapered shape when viewed in the cross section. Therefore, the first side surface 1SS may be a plane extended along the shortest path. Accordingly, in this example embodiment, the shortest distance L1 from line BS-1SS, where the bottom surface BS of the upper substrate meets the first side surface 1SS of the upper substrate 250, to line TS-1SS, where the top surface TS of the upper substrate meets the first side surface 1SS of the upper substrate 250, may be equal to the length of the first side surface 1SS in the cross section.

Figure 3:
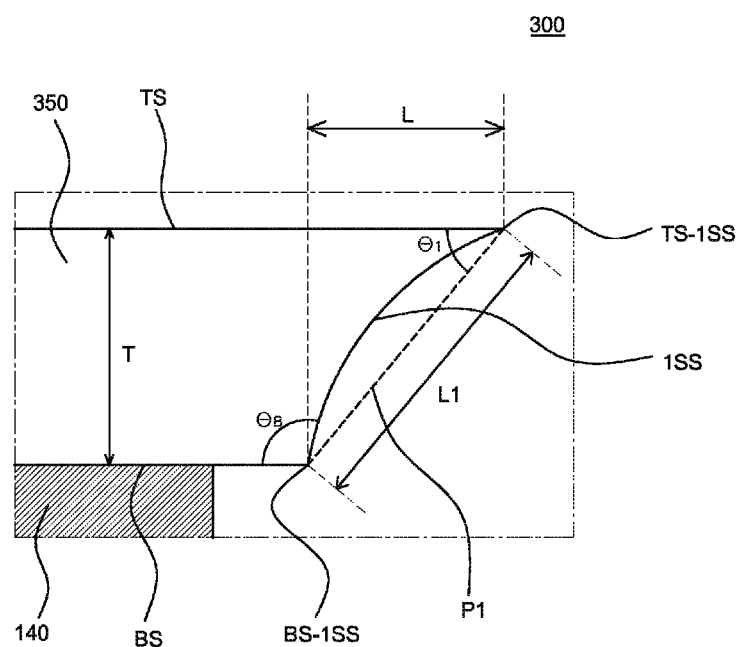
FIG. 3 is a cross-sectional view of an OLED device according to yet another example embodiment of the present disclosure.

FIG. 3 is a cross-sectional view of an OLED device 300 according to yet another example embodiment of the present disclosure. The OLED device 300 shown in FIG. 3 may be identical to the OLED device 200 shown in FIG. 2, except for the shape of a first side surface 1SS of an upper substrate 350. Therefore, FIG. 3 shows an enlarged portion of the upper substrate 250 and the adhesive layer 140, and other elements are not depicted in FIG. 3 for convenience of illustration. Further, descriptions of the same or similar elements as those in the above example embodiments may be omitted.

The first side surface 1SS of the upper substrate 350 is extended from one end of the bottom surface BS of the upper substrate 350. The first side surface 1SS and the bottom surface BS of the upper substrate 350 make an obtuse angle $\theta_B$. The in-plane area of the upper substrate 350 may increase continuously from the bottom surface BS to the top surface TS of the upper substrate 350, possibly non-linearly. That is, when viewed in the cross section, the first side surface 1SS of the upper substrate 350 may have a curved, reverse-tapered shape. For example, as shown in FIG. 3, the first side surface 1SS of the upper substrate 350 may have a concave surface. In addition, the first side surface 1SS of the upper substrate 350 may have a convex surface, although this is not shown in the drawing.

The upper substrate 350 may be cut, e.g., via a press process or an etching process. The shape of the first side surface 1SS may be determined depending on the condition of processes. For example, in a press process, the upper substrate 350 may be cut by using a mechanical cutter such as a blade or the like. As a result, the side shape of the upper substrate 350 may be a flat surface. On the other hand, in an etching process, the upper substrate 350 is cut by using an etchant for a metal material. As a result, the side shape of the upper substrate 350 may be a concave surface by the circulation of an etchant solution. The above-mentioned processes are merely examples, and various processes may be employed depending on the characteristics of the metal material and processing conditions.

The angle $\theta_1$, which is made by the top surface TS of the upper substrate 350 and the plane P1 extended along the shortest path from line BS-1SS where the bottom surface BS meets the first side surface 1SS of the upper substrate 350 to line TS-1SS where the top surface TS meets the first side surface 1SS of the upper substrate 350, may be equal to or greater than 60° (degrees) and less than 90° (degrees). Accordingly, the distance L indicating a protrusion length of the first side surface 1SS of the upper substrate 350 may be limited.

According to this example embodiment, because the first side surface 1SS of the upper substrate 350 has a concave surface, plane P1, extended along the shortest path from line BS-1SS where the bottom surface BS meets the first side surface 1SS of the upper substrate 350 to line TS-1SS where the top surface TS meets the first side surface 1SS of the upper substrate 350, may not correspond to the first side surface 1SS of the upper substrate 350. That is, the distance L indicating a protrusion length of the first side surface 1SS of the upper substrate 350 may be determined depending on the angle $\theta_1$ made by the top surface TS of the upper substrate 350 and the plane P1.

In addition, the distance L indicating a protrusion length of the first side surface 1SS of the upper substrate 350 may be defined as the distance that is the projection, onto the top surface TS of the upper substrate 350, of the shortest distance L1 from line BS-1SS where the bottom surface BS of the upper substrate 350 meets the first surface 1SS of the upper substrate 350, to line TS-1SS where the top surface TS of the upper substrate 350 meets the first surface 1SS.

In the OLED device 300 according to this example embodiment of the present disclosure, the first side surface 1SS of the upper substrate 350 may have a curved shape. In this case, the distance L indicating a protrusion length of the first side surface 1SS of the upper substrate 350 may be limited by adjusting the angle $\theta_1$ made by the top surface TS of the upper substrate 350 and plane P1 extended along the shortest path from line BS-1SS where the bottom surface BS meets the first side surface 1SS of the upper substrate 350 to line TS-1SS where the top surface TS meets the first side surface 1SS of the upper substrate 350. In this manner, the side portion of the upper substrate 350 may be less likely to overly protrude toward the lower substrate 110 or the driving film 260 such that possible reliability issues due to the deformation of the upper substrate 350 may be resolved. As a result, the reliability and the productivity of the OLED device 300 may be improved.

Figure 4:
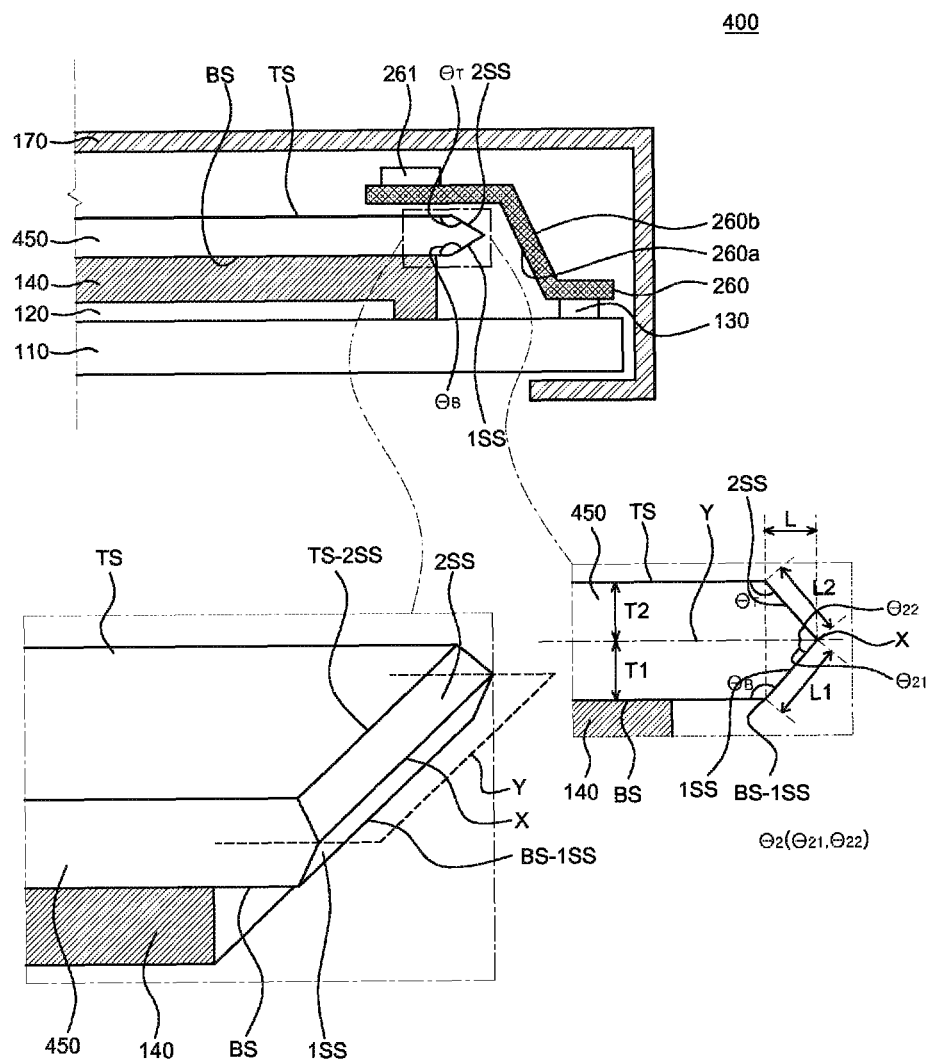
FIG. 4 shows a cross-sectional view and a perspective view of an OLED device according to still another example embodiment of the present disclosure.

FIG. 4 shows a cross-sectional view and a perspective view of an OLED device 400 according to still another example embodiment of the present disclosure. The OLED device 400 shown in FIG. 4 may be identical to the OLED device 200 shown in FIG. 2 except for the shape of an upper substrate 450. Therefore, the same or similar elements as those described in the above example embodiments may not be described.

With reference to FIG. 4, the upper substrate 450 may include a bottom surface BS, a top surface TS opposed to the bottom surface BS, a first side surface 1SS, and a second side surface 2SS. The first side surface 1SS of the upper substrate 450 is extended from one end of the bottom surface BS of the upper substrate 450. The first side surface 1SS and the bottom surface BS of the upper substrate 450 make an obtuse angle $\theta_B$. The second side surface 2SS of the upper substrate 450 is extended from one end of the top surface TS of the upper substrate 450. The second side surface 2SS and the top surface TS of the upper substrate 450 make an obtuse angle $\theta_T$. Each of the first side surface 1SS and the second side surface 2SS of the upper substrate 450 has a flat surface and may have a straight-line shape when viewed in the cross section. In other words, the first side surface 1SS of the upper substrate 450 may have a straight-line, reverse-tapered shape, and the second side surface 2SS of the upper substrate 450 may have a straight-line, tapered shape.

The in-plane area of the upper substrate 450 may increase continuously and decrease back continuously from the bottom surface BS to the top surface TS of the upper substrate 450. With reference to FIG. 4, the first side surface 1SS of the upper substrate 450 corresponds to the portion where the in-plane area of the upper substrate 450 increases continuously from the bottom surface BS to the top surface TS of the upper substrate 450. The second side surface 2SS of the upper substrate 450 corresponds to the portion where the in-plane area of the upper substrate 450 decreases back continuously toward the top surface TS of the upper substrate 450. As described above, because the first side surface 1SS and the second side surface 2SS have a straight-line shape when viewed in the cross section, the in-plane area of the upper substrate 450 increases linearly and decreases back linearly from the bottom surface BS to the top surface TS of the upper substrate 450. That is, the in-plane area of the upper substrate 450 continuously increases from the bottom surface BS of the upper substrate 450 to a particular position, for example, line X, and continuously decreases from line X to the top surface TS of the upper substrate 450.

In this example embodiment, each of the first side surface 1SS and the second side surface 2SS of the upper substrate 450 may have a flat surface and a straight-line shape when viewed in the cross section. Therefore, each of the first side surface 1SS and the second side surface 2SS may be a plane extended along the shortest path. Accordingly, a plane extended along the shortest path from line BS-1SS, where the bottom surface BS meets the first side surface 1SS of the upper substrate 450, to line X, may correspond to the first side surface 1SS. A plane extended along the shortest path from line TS-2SS, where the top surface TS meets the second side surface 2SS of the upper substrate 450, to line X, may correspond to the second side surface 2SS.

It may be desirable to have the protruding distance of the side portion of the upper substrate 450 to be as short as possible to the extent that an external impact can be relieved and dispersed. For example, when the first side surface 1SS of the upper substrate 450 meets the second side surface 2SS at line X as shown in FIG. 4, the angle $\theta_2$, which may be made by the first plane extended along the shortest path from line BS-1SS, where the bottom surface BS meets the first side surface 1SS of the upper substrate 450, to line X, and the second plane extended along the shortest path from line TS-2SS, where the top surface TS of the upper substrate 450 meets the second surface 2SS, to line X, may be equal to or greater than 60 degrees and less than 180 degrees. Accordingly, the distance L indicating a protrusion length of the first side surface 1SS and the second surface 2SS of the upper substrate 450 may be limited. If the side portion of the upper substrate 450 overly protrudes, it may be difficult to handle the upper substrate 450 during the manufacturing process of the OLED device 400. Also, a scratch may be made by the device on the processing equipment handling the upper substrate 250, and this may require an unnecessary replacement of the equipment components. As a result, the productivity of the OLED device 400 may decrease.

As shown in the perspective view of FIG. 4, presuming an imaginary plane Y that is parallel with the bottom surface BS of the upper substrate 450 and includes line X where the first side surface 1SS meets the second side surface 2SS, the distance L indicating a protrusion length of the first side surface 1SS and the second surface 2SS of the upper substrate 450 may be defined as the projection of the first side 1SS or the second side surface 2SS onto plane Y. The distance L that is the projection of the first side surface 1SS or the second side surface 2SS onto plane Y may be expressed by Equations 2 and 3:

$$L = \frac{T_1}{\tan\theta_{21}} \quad \text{[Equation 2]}$$

$$L = \frac{T_2}{\tan\theta_{22}} \quad \text{[Equation 3]}$$

where T1 and T2 denote the shortest distance from the bottom surface BS and top surface TS of the upper substrate 450, respectively, to plane Y. The sum of T1 and T2 is equal to the thickness of the upper substrate 450. In addition, $\theta_{21}$ and $\theta_{22}$ denote angles made by the first side surface 1SS and the second side surface 2SS, respectively, and plane Y. The sum of $\theta_{21}$ and $\theta_{22}$ is equal to $\theta_2$. With reference to FIG. 4, the first side surface 1SS and the second side surface 2SS are symmetric with each other with respect to plane Y when viewed in the cross section. Accordingly, the middle portion of the side surface of the upper substrate 450 protrudes. That is, the shortest distance T1 from the bottom surface BS of the upper substrate 550 to plane Y may be equal to the shortest distance T2 from the top surface TS of the upper substrate 550 to plane Y. In this case, $\theta_{21}$ may be equal to $\theta_{22}$. In other words, line X where the first side surface 1SS meets the second side surface 2SS may be located in the middle between the top surface TS and the bottom surface BS of the upper substrate 650.

As described above, the side portion of the upper substrate 450 may continually receive an external impact during the manufacturing process, such as an alignment process, so that it may be deformed. In contrast, in the OLED device 400 according to this example embodiment of the present disclosure, the upper substrate 450 includes the first side surface 1SS in a reverse-tapered shape and the second side surface 2SS in a tapered shape, and line X where the first side surface 1SS meets the second side surface 2SS is located in the middle of the side portion, so that an external impact can be relieved and dispersed by protruding middle portion of the side surface of the upper substrate 450. Accordingly, the side portion of the upper substrate 450 may be less deformed toward the lower substrate 110 or the driving film 260 such that the possible reliability issue due to the deformation of the upper substrate 450 may be resolved. As a result, the reliability and the productivity of the OLED device 400 may be improved.

Figure 5:
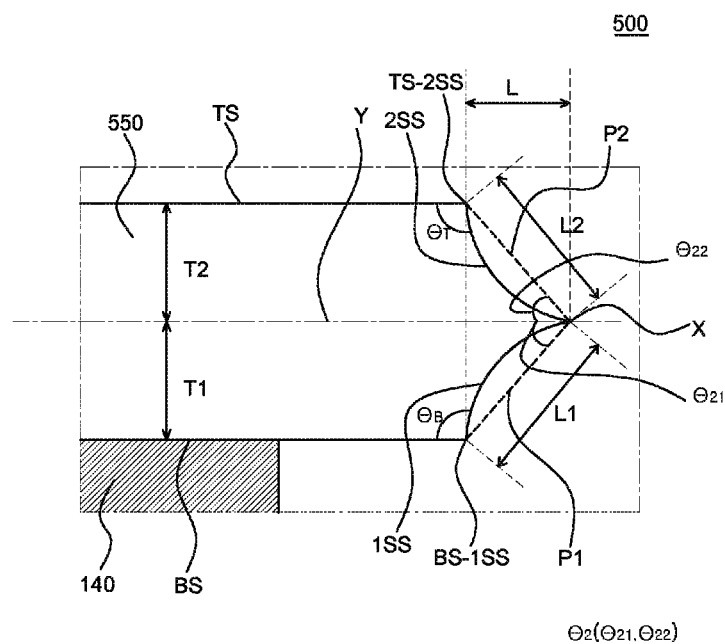
FIG. 5 is a cross-sectional view of an OLED device according to yet another example embodiment of the present disclosure.

FIG. 5 is a cross-sectional view of an OLED device 500 according to yet another example embodiment of the present disclosure. The OLED device 500 shown in FIG. 5 may be identical to the OLED device 400 shown in FIG. 4, except for the shape of a side surface of an upper substrate 550. Therefore, FIG. 5 shows an enlarged portion of the upper substrate 550, and the adhesive layer 140 and other elements are not depicted in FIG. 5 for convenience of illustration. Further, descriptions of the same or similar elements as those in the above example embodiments may be omitted.

The first side surface 1SS of the upper substrate 550 is extended from one end of the bottom surface BS of the upper substrate 550. The first side surface 1SS and the bottom surface BS of the upper substrate 550 make an obtuse angle $\theta_B$. The second side surface 2SS of the upper substrate 550 is extended from one end of the top surface TS of the upper substrate 550. The second side surface 2SS and the top surface TS of the upper substrate 450 also make an obtuse angle $\theta_T$. The in-plane area of the upper substrate 550 may increase non-linearly from the bottom surface BS to the top surface TS of the upper substrate 550 and may decrease back non-linearly. That is, the in-plane area of the upper substrate 550 may continuously increase from the bottom surface BS of the upper substrate 550 to a particular position, for example, line X, and may continuously decrease from line X to the top surface TS of the upper substrate 550. The first side surface 1SS may correspond to the portion where the in-plane area of the upper substrate 550 increases non-linearly. The second side surface 2SS may correspond to the portion where the in-plane area of the upper substrate 550 decreases non-linearly. In other words, the first side surface 1SS may have a curved, reverse-tapered shape, and the second side surface 2SS may have a curved, tapered shape.

For example, as shown in FIG. 5, the first side surface 1SS and the second side surface 2SS of the upper substrate 550 may have a concave surface.

As described above, the shape of the first side surface 1SS of the upper substrate 550 may be determined depending on the process of cutting the upper substrate 550. The upper substrate 550 may be cut via a press process or an etching process.

With reference to FIG. 5, the angle $\theta_2$, which is made by plane 1 extended along the shortest path from line BS-1SS, where the bottom surface BS meets the first side surface 1SS of the upper substrate 550, to line X, where the first side surface 1SS meets the second side surface 2SS, and plane P2 extended along the shortest path from line TS-2SS, where the top surface TS of the upper substrate 550 meets the second surface 2SS, to line X, may be equal to or greater than 60° (degrees) and less than 180° (degrees). Accordingly, the distance L indicating a protrusion length of the first side surface 1SS and the second surface 2SS of the upper substrate 550 may be limited.

According to this example embodiment, because each of the first side surface 1SS and the second side surface 2SS of the upper substrate 550 may have a concave surface, plane P1 extended along the shortest path from line BS-1SS, where the bottom surface BS meets the first side surface 1SS of the upper substrate 550, to line X, does not correspond to the first side surface 1SS of the upper substrate 550. Further, plane P2 extended along the shortest path from line TS-2SS, where the top surface TS meets the second side surface 2SS of the upper substrate 550, to line X, does not correspond to the second side surface 2SS of the upper substrate 550. That is, the distance L indicating a protrusion length of the first side surface 1SS and the second surface 2SS of the upper substrate 550 may be determined depending on the angles $\theta_2$ between plane P1 and plane P2. In addition, the distance L indicating a protrusion length of the first side surface 1SS and the second surface 2SS of the upper substrate 550 may be defined as the projection, onto plane Y, of the shortest distance L1 from line BS-1SS where the bottom surface BS of the upper substrate 550 meets the first surface 1SS to line X or the projection, onto plane Y, of the shortest distance L2 from line TS-2SS where the top surface TS of the upper substrate 550 meets the second surface 2SS to line X.

In the OLED device 500 according to this example embodiment of the present disclosure, the first side surface 1SS and the second side surface 2SS of the upper substrate 550 may have a curved shape. In this case, by adjusting the angles $\theta_2$ between plane P1 and plane P2, the protruding length of the upper substrate 550 may be limited. In this manner, an external impact can be relieved and dispersed by means of a protruding middle portion of the side surface of the upper substrate 550. Thus, reliability issues due to the deformation of the upper substrate 450 caused when the upper substrate 550 is bent in an unwanted direction may be resolved. As a result, the reliability and the productivity of the OLED device 500 may be improved.

Figure 6:
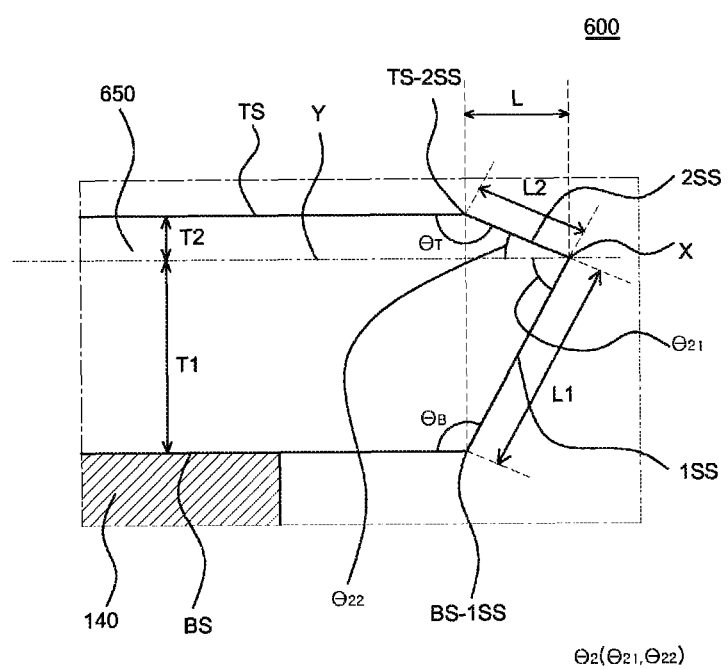
FIG. 6 is a cross-sectional view of an OLED device according to still another example embodiment of the present disclosure.

FIG. 6 is a cross-sectional view of an OLED device 600 according to yet another example embodiment of the present disclosure. The OLED device 600 shown in FIG. 6, like the OLED device 500 shown in FIG. 5, may be identical to the OLED device 400 shown in FIG. 4, except for the shape of a side surface of an upper substrate 650. Therefore, FIG. 6 shows an enlarged portion of the upper substrate 650 and the adhesive layer 140, and other elements are not depicted in FIG. 6 for convenience of illustration. Further, descriptions of the same or similar elements as those in the above example embodiments may be omitted.

With reference to FIG. 6, the shortest distance T1 from the bottom surface BS of the upper substrate 650 to plane Y may be greater than the shortest distance T2 from the top surface TS of the upper substrate 650 to plane Y. That is, line X where the first side surface 1SS meets the second side surface 2SS may be located closer to the top surface TS than the bottom surface BS of the upper substrate 650. In this case, if the side portion of the upper substrate 650 is deformed due to an external impact or the like, the upper substrate 650 is more likely to be bent toward the driving film 260 than the lower substrate 110. Accordingly, defects which occur when the upper substrate 650 comes in contact with lines formed on the lower substrate 110 may be reduced so that the lines are not burnt out.

As shown in FIG. 6, because line X is closer to the top surface TS than bottom surface BS of the upper substrate 650, the angle $\theta_{22}$ made by the second side surface 2SS and plane Y is smaller than the angle $\theta_{21}$ made by the first side surface 1SS and plane Y. In addition, the angle $\theta_2$ made by the first side surface 1SS and the second side surface 2SS is the sum of the angle $\theta_{21}$ made by the first side surface 1SS and plane Y and the angle $\theta_{22}$ made by the second side surface 2SS and plane Y, and may be equal to or greater than 60° (degrees) and less than 180° (degrees).

The distance L indicating a protrusion length of the first side surface 1SS and the second surface 2SS of the upper substrate 650 may also be limited by the angle $\theta_{21}$ made by the first side surface 1SS and plane Y or the angle $\theta_{22}$ made by the second side surface 2SS and plane Y. As described above, the distance L indicating a protrusion length of the first side surface 1SS and the second surface 2SS of the upper substrate 650 may be defined as the projection, onto plane Y, of the shortest distance L1 from line BS-1SS where the bottom surface BS of the upper substrate 650 meets the first surface 1SS to line X or the projection, onto plane Y, of the shortest distance L2 from line TS-2SS where the top surface TS of the upper substrate 650 meets the second surface 2SS to line X. In addition, according to this example embodiment, the distance L (indicating a protrusion length of the first side surface 1SS and the second surface 2SS of the upper substrate 650) may be regarded as the projection of the first side surface 1SS or the second side surface 2SS onto plane Y.

In the OLED device 600 according to this example embodiment of the present disclosure, line X (where the first side surface 1SS meets the second side surface 2SS of the upper substrate 650) may be located closer to the top surface TS than the bottom surface BS of the upper substrate 650. In this manner, even if the side portion of the upper substrate 650 is deformed due to an external impact or the like, the upper substrate 650 is more likely to be bent toward the driving film 260 than the lower substrate 110. Accordingly, reliability issues which may occur when the upper substrate 650 comes in contact with lines formed on the lower substrate 110 may be resolved.

Thus far, example embodiments of the present disclosure have been described in detail with reference to the accompanying drawings. However, the present disclosure is not limited to the example embodiments, and modifications and variations can be made thereto without departing from the technical idea of the present disclosure. Accordingly, the example embodiments described herein are merely illustrative and are not intended to limit the scope of the present disclosure. The technical idea of the present disclosure is not limited by the example embodiments. Therefore, it should be understood that the above-described embodiments are not limiting but are illustrative in all aspects. The protection scope of the present disclosure must be analyzed by the appended claims and it should be analyzed that all spirits within a scope equivalent thereto are included in the appended claims of the present disclosure.

It will be apparent to those skilled in the art that various modifications and variations can be made in the display device of the present invention without departing from the spirit or scope of the invention. Thus, it is intended that the present invention cover the modifications and variations of this invention provided they come within the scope of the appended claims and their equivalents.

What is claimed is:

1. An organic light-emitting display (OLED) device, comprising:
    an organic light-emitting element between a lower substrate and an upper substrate,
    wherein at least a part of a side surface of the upper substrate has a reverse-tapered shape configured to reduce damage to the lower substrate caused by deformation of the upper substrate due to an external impact, and
    wherein the upper substrate has an area of a top surface larger than that of a bottom surface of the upper substrate.

2. The OLED device of claim 1, wherein:
    the upper substrate comprises a first side surface having a reverse-tapered shape; and
    the first side surface of the upper substrate has a straight-line shape or a curved shape in a vertical cross section view of the upper substrate.

3. The OLED device of claim 2, wherein:
    the first side surface of the upper substrate spans from one end of a bottom surface of the upper substrate to one end of a top surface of the upper substrate; and
    an angle made by the top surface of the upper substrate and the first side surface of the upper substrate is equal to or greater than sixty degrees and less than ninety degrees.

4. The OLED device of claim 2, wherein:
    the first side surface of the upper substrate spans from one end of the bottom surface of the upper substrate to one end of a top surface of the upper substrate; and
    an angle made by the top surface of the upper substrate and a plane is equal to or greater than sixty degrees and less than ninety degrees, the plane extended along a shortest path from a line where the bottom surface of the upper substrate meets the first side surface of the upper substrate, to a line where the top surface of the upper substrate meets the first side surface of the upper substrate.

5. The OLED device of claim 2, wherein:
    the upper substrate further comprises a second side surface having a tapered shape; and
    the second side surface of the upper substrate has a straight-line shape or a curved shape in the vertical cross section view of the upper substrate.

6. The OLED device of claim 1, wherein an in-plane area of the upper substrate increases continuously from the bottom surface of the upper substrate to the top surface of the upper substrate.

7. The OLED device claim 6, wherein the in-plane area of the upper substrate increases linearly.

8. The OLED device claim 6, wherein the in-plane area of the upper substrate increases non-linearly.

9. The OLED device of claim 6, wherein the in-plane area of the upper substrate increases continuously from the bottom surface of the upper substrate to a particular position and decreases continuously from the particular position to the top surface of the upper substrate.

10. An organic light-emitting display (OLED) device, comprising:
    an organic light-emitting element on a top surface of a lower substrate;
    an upper metal substrate having a bottom surface facing the top surface of the lower substrate; and
    an adhesive layer between the lower substrate and the upper metal substrate configured to seal the organic light-emitting element,
    wherein the upper metal substrate comprises a first side surface at an obtuse angle with respect to the bottom surface of the upper metal substrate, and
    wherein the first side surface is at an acute angle with respect to a top surface of the upper metal substrate.

11. The OLED device of claim 10, wherein the first side surface of the upper metal substrate spans from one end of the bottom surface of the upper metal substrate to the top surface of the upper metal substrate.

12. The OLED device of claim 11, wherein an area of the top surface of the upper metal substrate is greater than an area of the bottom surface of the upper metal substrate.

13. The OLED device of claim 12, wherein the first side surface of the upper metal substrate has a straight-line shape or a curved shape in a cross section view.

14. The OLED device of claim 12, wherein an angle between the top surface of the upper metal substrate and a plane is equal to or greater than sixty degrees and less than ninety degrees,
    the plane extended along a shortest path from a line where the bottom surface of the upper metal substrate meets the first side surface of the upper metal substrate, to a line where the top surface of the upper metal substrate meets the first side surface of the upper metal substrate.

15. An organic light-emitting display (OLED) device, comprising:
    an organic light-emitting element on a top surface of a lower substrate;
    an upper metal substrate having a bottom surface facing the top surface of the lower substrate; and
    an adhesive layer between the lower substrate and the upper metal substrate configured to seal the organic light-emitting element,
    wherein the upper metal substrate comprises a first side surface at an obtuse angle with respect to the bottom surface of the upper metal substrate,
    wherein the upper metal substrate further comprises a second side surface at an obtuse angle with respect to the top surface of the upper metal substrate, and
    wherein:
    the first side surface of the upper metal substrate meets the second side surface of the upper metal substrate to define a line X;
    an angle between a first plane and a second plane is equal to or greater than sixty degrees and less than one hundred eighty degrees;
    the first plane extends along a shortest path from a line where the bottom surface of the upper metal substrate meets the first side surface of the upper metal substrate, to the line X; and
    the second plane extends along a shortest path from a line where the top surface of the upper metal substrate meets the second side surface of the upper metal substrate, to the line X.

16. The OLED device of claim 15, wherein the second side surface of the upper metal substrate has a straight-line shape or a curved shape in a cross section view.

17. The OLED device of claim 15, wherein:
- a plane Y is parallel with the bottom surface of the upper metal substrate and comprises the line X; and
- a shortest distance from the bottom surface of the upper metal substrate to the plane Y is equal to or greater than a shortest distance from the top surface of the upper metal substrate to the plane Y.

18. An organic light-emitting display device, comprising:
- an upper substrate, an organic light-emitting element, and a lower substrate, each of the upper substrate and the lower substrate including a top surface and a bottom surface, and the organic light-emitting element between the bottom surface of the upper substrate and the top surface of the lower substrate;
- wherein a protruding portion of the upper substrate protrudes beyond the organic light-emitting element in a cross-section view;
- wherein the protruding portion of the upper substrate includes a side surface having a first side surface with a reverse-tapered shape; and
- wherein the top surface of the upper substrate has an area larger than that of the bottom surface of the upper substrate.

19. The organic light-emitting display device of claim 18, wherein the first side surface forms an obtuse angle with the bottom surface of the upper substrate.

20. The organic light-emitting display device of claim 19, wherein the side surface includes a second side surface having a tapered shape and forming an obtuse angle with the top surface of the upper substrate, the first and second side surfaces meeting at a furthest protrusion point of the protruding portion of the upper substrate.

21. The organic light-emitting display device of claim 20, wherein the first and second side surfaces are both either flat or concave.

22. The organic light-emitting display device of claim 19, wherein the first side surface is either flat or concave.

23. The organic light-emitting display device of claim 18, further comprising:
- a driving film attached to the top surface of the lower substrate and above the top surface of the upper substrate, a driver integrated circuit (IC) on one side of the driving film, and a pad on the other side of the driving film between the driving film and the top surface of the lower substrate, the lower substrate protruding further than the driving film in the cross-section view.

* * * * *